(12) United States Patent
Caër et al.

(10) Patent No.: US 11,075,307 B2
(45) Date of Patent: Jul. 27, 2021

(54) COMPACT ELECTRO-OPTICAL DEVICES WITH LATERALLY GROWN CONTACT LAYERS

(71) Applicant: International Business Machines Corporation, Armonk, NY (US)

(72) Inventors: Charles Caër, Adliswil (CH); Yannick Baumgartner, Thalwil (CH); Lukas Czornomaz, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/515,168

(22) Filed: Jul. 18, 2019

(65) Prior Publication Data

US 2021/0020796 A1    Jan. 21, 2021

(51) Int. Cl.
*H01L 31/0224* (2006.01)
*H01L 31/0232* (2014.01)
(Continued)

(52) U.S. Cl.
CPC ........ *H01L 31/022408* (2013.01); *G02B 6/13* (2013.01); *H01L 27/1443* (2013.01);
(Continued)

(58) Field of Classification Search
CPC ......... H01L 31/022408; H01L 27/1443; H01L 31/02327; H01L 31/105; H01L 31/1844;
(Continued)

(56) References Cited

U.S. PATENT DOCUMENTS

| 9,229,164 B2 | 1/2016 | Assefa et al. |
| 2004/0188794 A1* | 9/2004 | Gothoskar ........ H01L 31/03682 257/459 |

(Continued)

FOREIGN PATENT DOCUMENTS

CN    102779892 A    11/2012

OTHER PUBLICATIONS

Baumgartner et al., "CMOS-Compatible Hybrid III-V/Si Photodiodes Using a Lateral Current Collection Scheme," 2018 European Conference on Optical Communication (ECOC), IEEE, 2018, 3 pages.
(Continued)

*Primary Examiner* — Dzung Tran
(74) *Attorney, Agent, or Firm* — Cantor Colburn LLP; Daniel Morris

(57) ABSTRACT

Embodiments of the invention are directed to a method of fabrication of an electro-optical device. A non-limiting example of the method relies on a waveguide. A trench is opened in the waveguide and a stack of optically active semiconductor materials is directly grown from a bottom wall of the trench and are stacked along a stacking direction that is perpendicular to a main plane of the waveguide. The stack is partly encapsulated in the waveguide, whereby a bottom layer of the stack is in direct contact with a waveguide core material, whereas upper portions of opposite, lateral sides of the stack are exposed. An insulating layer of material is deposited to cover exposed surfaces of the waveguide and structured to form a lateral growth template. Contact layers are laterally grown due to the lateral growth template formed. The contact layers can include an n-doped and p-doped contact layers.

9 Claims, 5 Drawing Sheets

(51) Int. Cl.
*H01L 31/18* (2006.01)
*H01L 27/144* (2006.01)
*G02B 6/13* (2006.01)
*H01L 31/105* (2006.01)
*G02B 6/12* (2006.01)

(52) U.S. Cl.
CPC ...... *H01L 31/02327* (2013.01); *H01L 31/105* (2013.01); *H01L 31/1844* (2013.01); *G02B 2006/12061* (2013.01); *G02B 2006/12078* (2013.01); *G02B 2006/12123* (2013.01); *G02B 2006/12138* (2013.01)

(58) Field of Classification Search
CPC ............ G02B 6/13; G02B 2006/12061; G02B 2006/12078; G02B 2006/12123; G02B 2006/12138
USPC ........................................................ 257/472
See application file for complete search history.

(56) References Cited

U.S. PATENT DOCUMENTS

| | | | | |
|---|---|---|---|---|
| 2007/0170536 | A1* | 7/2007 | Hsu | H01L 31/1055 257/458 |
| 2010/0327381 | A1* | 12/2010 | Morse | G02B 6/132 257/432 |
| 2012/0025195 | A1* | 2/2012 | McComber | C30B 23/04 257/65 |
| 2013/0020556 | A1* | 1/2013 | Bowers | H01L 31/02327 257/21 |
| 2018/0190693 | A1* | 7/2018 | Borg | H01S 5/3013 |

OTHER PUBLICATIONS

Feng et al., "Epitaxial III-V-on-silicon waveguide butt-coupled photodetectors," Optics Letters 37.19 (2012): 4035-4037.
Hahn et al., "Towards electro-optical integration of hybrid III-V on Si lasers into the BEOL of a CMOS technology," 2017 75th Annual Device Research Conference (DRC), IEEE, 2017, 3 pages.
Kunert et al., "III/V nano ridge structures for optical applications on patterned 300 mm silicon substrate," Applied Physics Letters 109.9 (2016): 091101.
Lischke et al., "High bandwidth, high responsivity waveguide-coupled germanium pin photodiode," Optics Express 23.21 (2015): 27213-27220.
Nozaki et al., "InGaAs nano-photodetectors based on photonic crystal waveguide including ultracompact buried heterostructure," Optics Express 21.16 (2013): 19022-19028.
Takagi, "Refractive index of ga1-xinxas prepared by vapor-phase epitaxy," Japanese Journal of Applied Physics 17.10 (1978): 1813-1817.
Virot et al., "High-performance waveguide-integrated germanium PIN photodiodes for optical communication applications," Photonics Research 1.3 (2013): 140-147.
Wan et al., "Monolithically integrated InAs/InGaAs quantum dot photodetectors on silicon substrates," Optics Express 25.22 (2017): 27715-27723.

* cited by examiner

COMPACT ELECTRO-OPTICAL DEVICES WITH LATERALLY GROWN CONTACT LAYERS

BACKGROUND

The invention relates in general to the field of electro-optical devices with layer stacks of optically active (e.g., group III-V or group IV) semiconductor materials, and methods of fabrication thereof. In particular, it relates to CMOS-compatible, shallow designs of hybrid lateral current injection/collection devices, enabling co-integration with integrated circuits.

For the monolithic integration of optoelectronic devices (e.g., lasers, optical detectors, semiconductor optical amplifiers) on CMOS platforms, shallow stacks of group III-V or group IV semiconductor materials are used, which are typically less than 500 nm thick. In particular, there is a need for integration of ultra-small photodetectors in silicon photonics platform relying on III-V or IV materials and operating at datacom or telecom wavelengths for low power on-chip optical interconnects.

SUMMARY

According to a first aspect, the present invention is embodied as a method of fabrication of an electro-optical device. The method relies on a waveguiding structure, in which a trench is opened. A stack of optically active semiconductor materials (e.g., optical gain materials or optically absorbing materials, such as group III-V or group IV semiconductor materials) is then directly grown from a bottom wall of the cavity formed by the trench. The semiconductor materials are stacked along a stacking direction z perpendicular to a main plane of the waveguiding structure. After the direct growth of the stack, the stack is partly encapsulated in the waveguiding structure, whereby a bottom layer of the stack is in direct contact with a waveguide core material of the waveguiding structure, whereas upper portions of opposite, lateral sides of the stack are exposed. Next, an insulating layer of material is deposited, for it to cover one or more exposed surfaces of the waveguiding structure. This insulating layer is then structured to form a lateral growth template. Subsequently, contact layers are laterally grown, due to the lateral growth template obtained. The contact layers comprise an n-doped contact layer and a p-doped contact layer of material, each extending from a respective one of the upper portions of opposite lateral sides of the stack, and essentially/substantially parallel to said main plane. Finally, further trenches are opened in the lateral growth template to form ohmic contacts extending through such trenches to contact respective ones of the contact layers obtained.

According to another aspect, the invention is embodied as an electro-optical device, which can be obtained according to a fabrication method as described above. Consistently, this device can include a waveguiding structure with a trench formed therein, as well as a stack of optically active semiconductor materials, which are stacked along a stacking direction z perpendicular to a main plane of the waveguiding structure. The stack rests on a bottom wall of the trench, in direct contact with a waveguide core material of the waveguiding structure, so as to be partly encapsulated (i.e., housed) in the waveguiding structure. The device further includes contact layers that include an n-doped contact layer and a p-doped contact layer of material. Each of the contact layers extends essentially/substantially parallel to said main plane, from a respective one of the upper portions of the opposite, lateral sides of the stack. Ohmic contacts extend through an insulating layer of material covering top surfaces of the contact layers and the stack, so as to contact respective ones of the contact layers.

The device can include residual portions of an insulating layer of material structured as a lateral growth template, where the latter includes inner surfaces bordering each of the contact layers. Preferably, the waveguiding structure is structured so as to form a bidimensional photonic crystal, with said trench arranged in a region forming a crystal lattice crystal lattice defect of the photonic crystal. In preferred embodiments, the waveguiding structure is structured from a top silicon layer of a silicon-on-insulator substrate.

Devices and fabrication methods embodying the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which:

FIGS. 3A-3H depict 2D cross-sectional views illustrating high-level fabrication steps of a device as in FIGS. 1 and 2, according to embodiments of the invention, in which:

FIG. 3A depicts the device after fabrication operations in accordance with embodiments of the invention;

FIG. 3B depicts the device after fabrication operations in accordance with embodiments of the invention;

FIG. 3C depicts the device after fabrication operations in accordance with embodiments of the invention;

FIG. 3D depicts the device after fabrication operations in accordance with embodiments of the invention;

FIG. 3E depicts the device after fabrication operations in accordance with embodiments of the invention;

FIG. 3F depicts the device after fabrication operations in accordance with embodiments of the invention;

FIG. 3G depicts the device after fabrication operations in accordance with embodiments of the invention; and FIG. 3H depicts the device after fabrication operations in accordance with embodiments of the invention.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

In reference to FIGS. 3A-3H, an aspect of the invention is first described, which concerns a method of fabrication of an electro-optical device 1. Note, this method and its variants are collectively referred to as "the present methods".

Figure 2A:
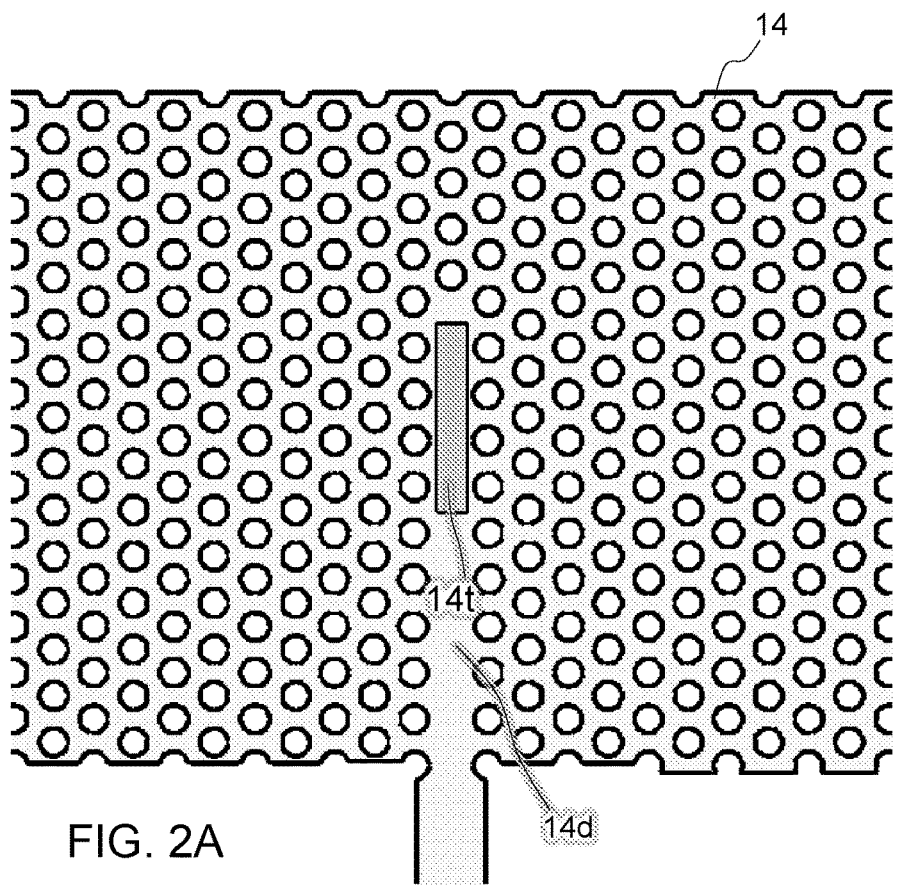
FIG. 2A is a top view of the device as in FIG. 1 showing the waveguiding structure, here formed as a bidimensional photonic crystal, with a trench provided in a central portion thereof, as in embodiments of the invention.
Figure 2B:
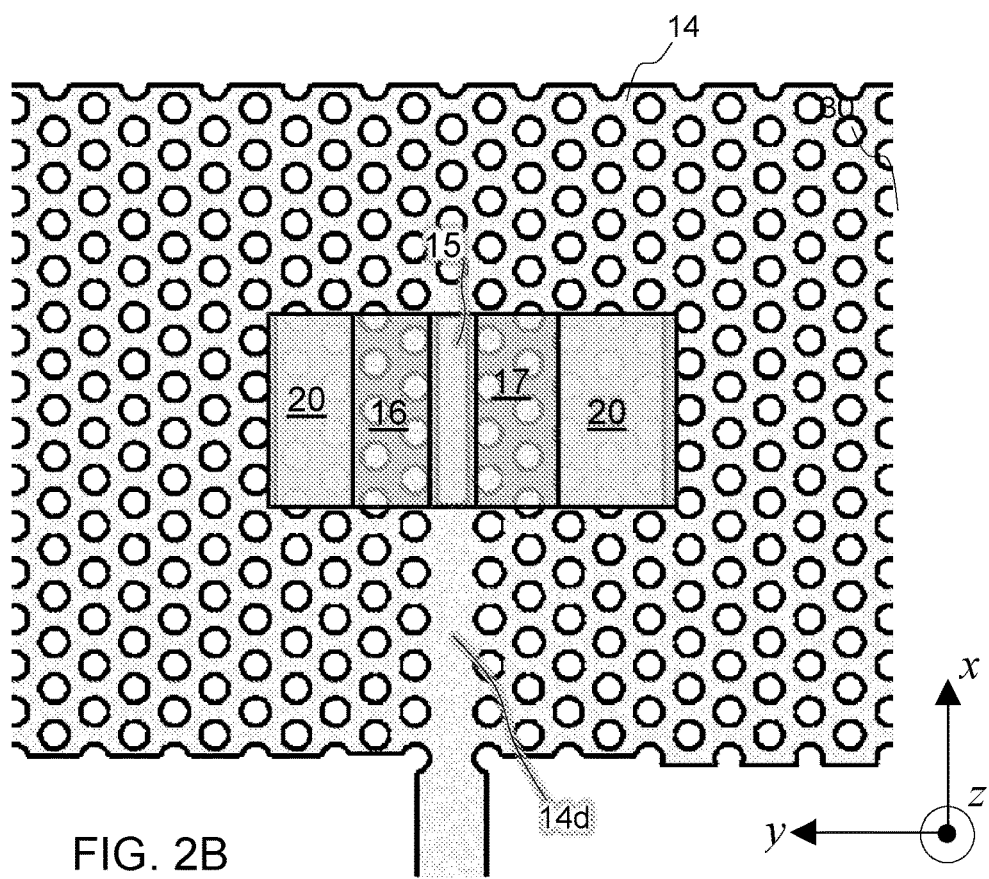
FIG. 2B is another top view of the device as in FIG. 1 further depicting additional layer portions (in transparence) structured on top of the photonic crystal, as in embodiments of the invention.
Figure 3A:
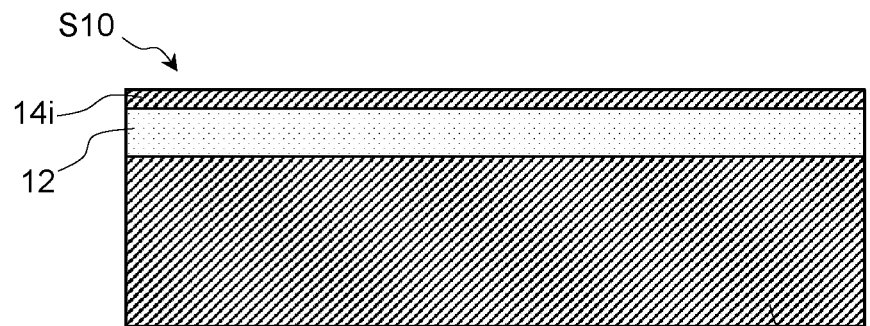
Figure 3B:
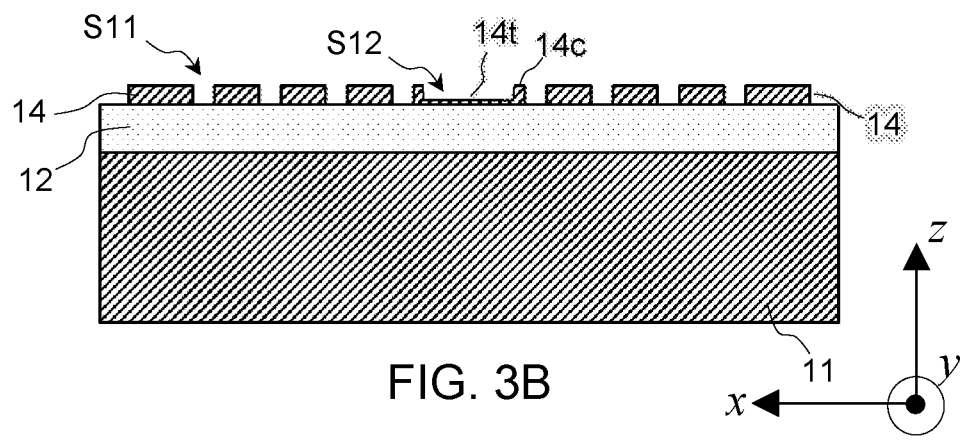

A waveguiding structure 14 is provided (steps S10-S11), as illustrated in FIGS. 3A-3B. The waveguiding structure can involve a usual, straight waveguide core material or, in more sophisticated variants, a photonic crystal, as assumed in the accompanying drawings (see, in particular, FIGS. 2A and 2B).

A trench 14t is opened (step S12 in FIG. 3B) in the waveguiding structure 14 provided, see also FIG. 2A. The trench 14t defined S12 in the waveguiding structure 14 forms a blind cavity, i.e., it is not a through hole. The cavity is defined by a bottom wall, surrounded by a peripheral, raised portion 14c.

A stack 15 of optically active semiconductor materials is directly grown S16 (FIG. 3D) from the bottom wall of the cavity defined by the trench 14t. Such a layer stack 16 is relatively easy to grow, using, e.g., molecular beam epitaxy (MBE) or metal-organic chemical vapor deposition (MOCVD). In the present context, such materials are preferably designed as optical gain materials or optically absorbing materials; they can involve group III-V semiconductors or group IV semiconductors. In preferred embodiments, such semiconductor materials form a direct bandgap III-V absorbing medium, as mostly assumed in the following for illustration purposes. The semiconductor materials can be doped, as necessary, and possibly in conjunction with strain, e.g., to tune the bandgap. Such materials 15 are stacked along a stacking direction z, which is perpendicular to the main plane P of the waveguiding structure 14. This plane P, which is parallel to the plane (x, y) in the accompanying drawings, is depicted as a dashed line in FIG. 1.

The direct growth of the stack 15 is performed so as for the stack 15 to be partly encapsulated in the waveguiding structure. In particular, a lower portion of the stack can be bordered by one or more raised, lateral portions 14c of the cavity defined by the trench 14t formed at step S12, FIG. 3B. In other words, the bottom wall of the cavity formed by the trench 14t serves as a support for the direct growth of the stack 15, and laterally constrains the latter. As a result of the direct growth of the stack, a bottom layer of the stack 15 is in direct contact with the waveguide core material of the waveguiding structure 14. On the contrary, upper portions of the opposite, lateral sides of the stack 15 are still exposed at this point (see FIG. 3D). Note, the upper portions of the lateral sides of the stack 15 shall typically be faceted in practice, yielding tapered lateral sides, owing to the direct growth method used for obtaining the optically active materials, as seen in the accompanying drawings. This point is discussed later in detail.

An insulating layer 182 of material is deposited S18. As a result, this layer 182 covers the exposed surface(s) of the waveguiding structure 14. Note, an intermediate cladding layer 181 can be deposited first, as discussed later. The layer 182 is furthermore structured S19 to form a lateral growth template 182-183. The resulting template 182-183 can include a horizontal layer portion 183 overhanging the stack 15. The template 182-183 is formed due to a structured, dielectric layer (typically SiO2), which defines a selective epitaxy mask with oriented channels 16c, 17c for the subsequent growth steps S20-S23.

Contact layers 16, 17 can be laterally grown S20-S23, due to the lateral growth template 182-183 previously formed. Such contact layers 16, 17 include an n-doped contact layer 16 and a p-doped contact layer 17 of material, which are preferably regrown, laterally, from the stack 15. In all cases, owing to the growth performed and the template 182-183 used, each contact layer 16, 17 extends from a lateral side of the stack 15. More precisely, and as seen in, e.g., FIG. 3E, the contact layers 16, 17 extend from respective upper portions of opposite lateral sides of the stack 15, as visible in FIG. 3E. Due to the growth template used, the contact layers 16, 17 are essentially/substantially parallel to the main plane P of the waveguide structure.

Additional trenches 19t are opened S26 in the lateral growth template 182-183, in order to form ohmic contacts 19, 20. The latter extend through the trenches 19t, so as to contact a respective contact layer 16, 17. The resulting device 1 can be configured as a lateral current injection or a lateral collection device, e.g., as a laser or photodetector.

The present methods take advantage of: (i) a direct growth of the optically active stack 15 from the waveguide core (e.g., a silicon waveguide core); and (ii) a templated, lateral growth, to obtain ultra-thin lateral devices with an optimal design (ultra-low capacitance and ultra-high bandwidth). The geometry obtained makes it notably possible to maximize carrier injection and collection. Moreover, the resulting devices 1 can be integrated at a front-end level. In other words, such devices can be directly integrated in the back end of the line of a CMOS process as the surrounding cladding is normally compatible with the integration of metal interconnects for CMOS circuits. The fabrication methods in accordance with embodiments of the invention can be used to obtain photodetectors with high-performance III-V photodiodes, whose designs outperform usual CMOS-integrated electro-optical devices, due to the use of a direct bandgap III-V absorbing medium and the geometry achieved. Note, however, that, beyond applications as optical detectors, the stack 15 of optically active semiconductor materials can be configured as a laser or a semiconductor optical amplifier (SOA).

All this is now described in detail, in reference to particular embodiments of the invention. The waveguiding structure 14 can initially be provided S10 as a silicon-on-insulator (SOI) substrate 11, 12, 14i, see FIG. 3A. The top silicon layer 14i of the SOI substrate can be structured S11 to form the waveguiding structure 14, as depicted in FIG. 3B, using usual lithography techniques.

The top silicon layer 14i of the SOI substrate can be structured S11 so as to form a bidimensional photonic crystal 14, see FIGS. 2A, 2B. In this example, the structure 14 shows periodic modulations of the refractive index in two directions in its main plane P, due to periodically arranged holes. The trench 14t can be opened S12 in a region 14d forming a crystal lattice defect, near the center, see FIG. 2A. This defect can be designed to cause an optical mode within the photonic frequency bandgap of the photonic crystal cavity (the photonic crystal cavity has a cavity frequency within this photonic frequency bandgap) and can be exploited to increase the efficiency of the cavity. In variants, though, a usual (straight) waveguide core can be used, in place of a photonic crystal.

Figure 3C:
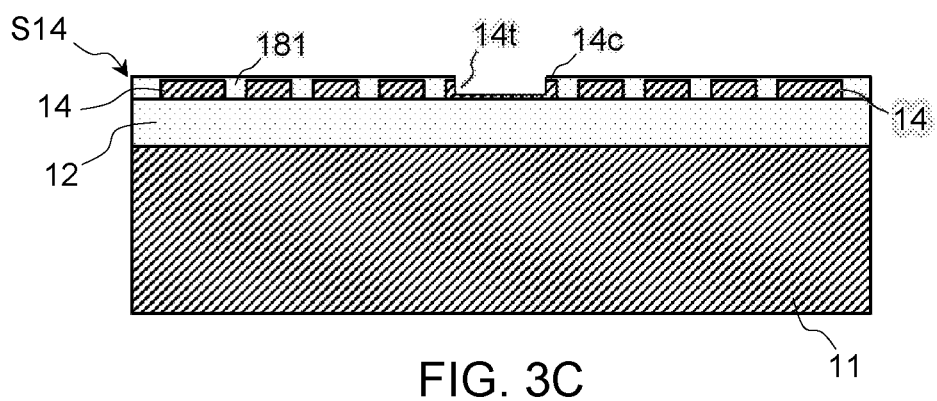
Figure 3D:
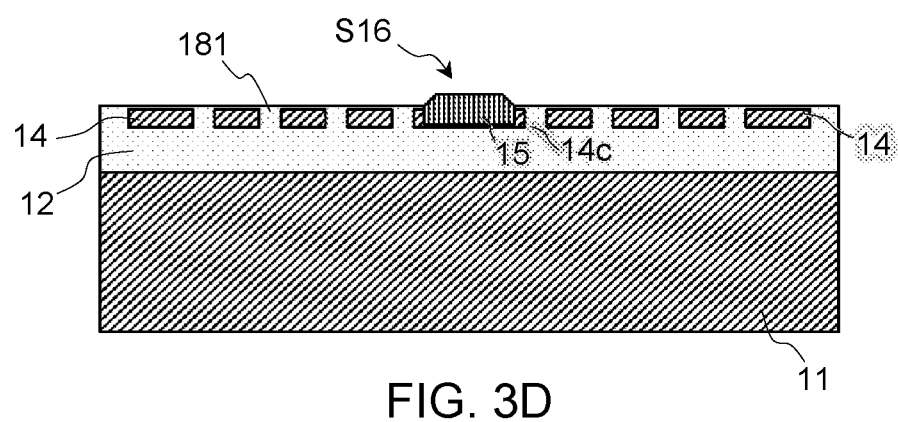

As seen in FIG. 3C, the waveguide structure obtained S10-S11 can be cladded S14, prior to growing S16 the stack 15 of optically active materials. Yet, the waveguide can be cladded S14 with a thin insulating layer 181, including, e.g., SiO2. The thickness of layer 181 depends on the thickness of the structures 14; it can for example be 250 nm thick, covering the waveguide structures by 30 nm of oxide. If necessary, a chemical and/or mechanical polishing (CMP) is performed after step S14. Note, the cladding S14 will normally be performed after having opened S12 the trench, as assumed in FIGS. 3B-3C. In variants, however, step S14 can be performed prior to opening the trench 14t in the waveguide structure 14.

Figure 3E:
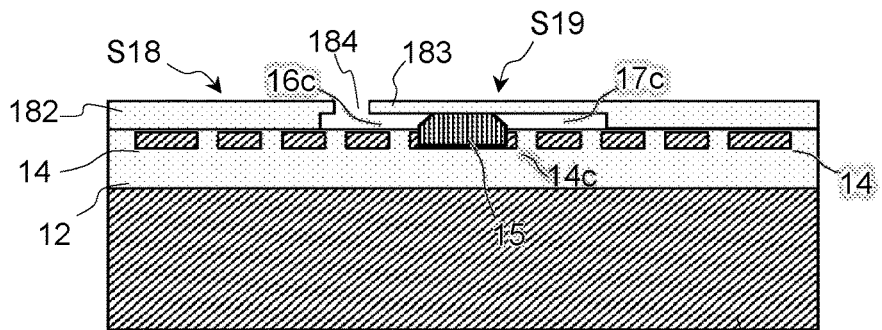

Referring to FIG. 3E, the lateral growth template 182-183 can be formed S18-S19 so as to include a layer portion 183 that extends parallel to the main plane P of the waveguiding structure 14. This layer portion 183 overhangs the stack 15, so as to define cavities 16c, 17c on each lateral side of the stack 15. Growth techniques relying on such growth templates are notably discussed in US2018190693 (A1). Similar techniques can be used herein.

The layer portion 183 further includes an aperture 184 on one side of the stack 15, see FIG. 3E. This aperture 184 can for instance be formed as a through hole, allowing access to the inner region 16c defined by the growth template. This, in turn, enables the subsequent growth of a first contact layer 16 from the left-hand side, lateral flank of the stack 15. When both contact layers 16, 17 are successively regrown (as assumed in the accompanying drawings), the aperture 184 need be masked S21 (yielding the cap 185) after having regrown the first contact layer 16, and, this, prior to opening S22 another aperture 186 for growing the other contact layer 17, as illustrated in FIG. 3F.

Figure 3F:
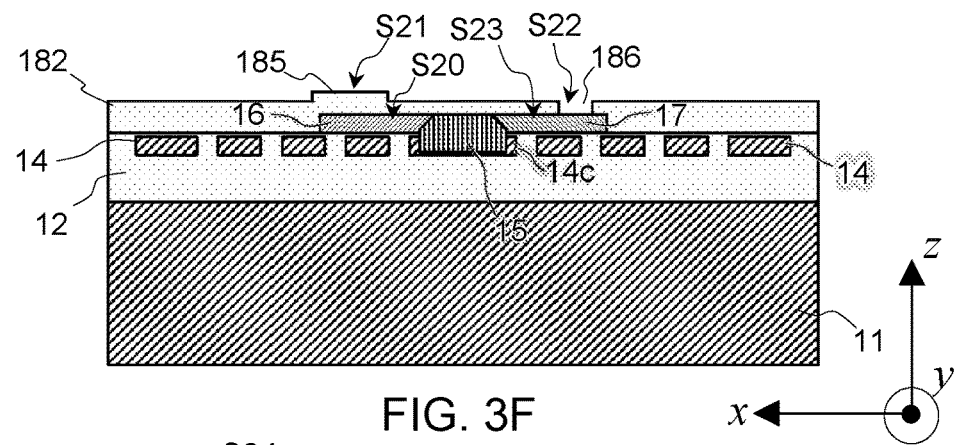

The scenario assumed in FIGS. 3E and 3F assumes successive regrowth steps. In other words, after having grown S16 the stack 15, contact layers 16, 17 are laterally regrown S20-S23, one after the other, due to the lateral growth template 182-186 formed, which requires to slightly restructure S21, S22 the template during the fabrication. In variants, one of the contact layers 16, 17 can be directly grown, following the direct growth of the stack 15 of optically active semiconductor materials, prior to laterally regrowing the other contact layer.

As previously noted, the optically active stack 15 can include group III-V or group IV semiconductor materials; it can include InGaAs compounds. Now, irrespective of the exact composition of the stack, the direct growth of the stack can typically lead to opposite, faceted surfaces, yielding tapered lateral surfaces on the upper portion of the stack, i.e., extending above the raised portions 14c of the cavity defined by the trench 14t, as assumed in FIGS. 3D-3H. In practice, such tapered surfaces correspond to external (111) surfaces, i.e., surfaces parallel to (111) crystallographic planes. The (111) surfaces form facets (i.e., tapers) with respect to the lower lateral surfaces (of the stack), which are perpendicular to the main surface P of the structure 14. Advantageously, each of the n-doped contact layer 16 and the p-doped contact layer 17 can be (re-)grown S20-S23, laterally, from such faceted (111) surfaces. In principle, (111) surfaces provide easier nucleation for the lateral regrowth and a better control of the position of the electrical junction compared to, e.g., (110) surfaces. Now, quite interestingly here, the faceted (111) surfaces can be achieved right above the straight (110) surfaces of the stack that are (at least partly) encapsulated in the cavity of the trench 14t, such that contact layers can be laterally (re-)grown from the sole upper (111) surfaces, thereby allowing a compact, shallow structure 15-17 to be achieved.

Figure 3G:
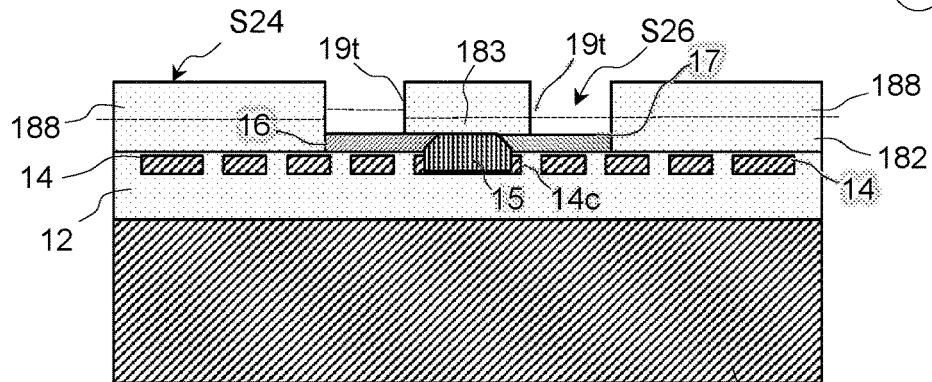
Figure 3H:
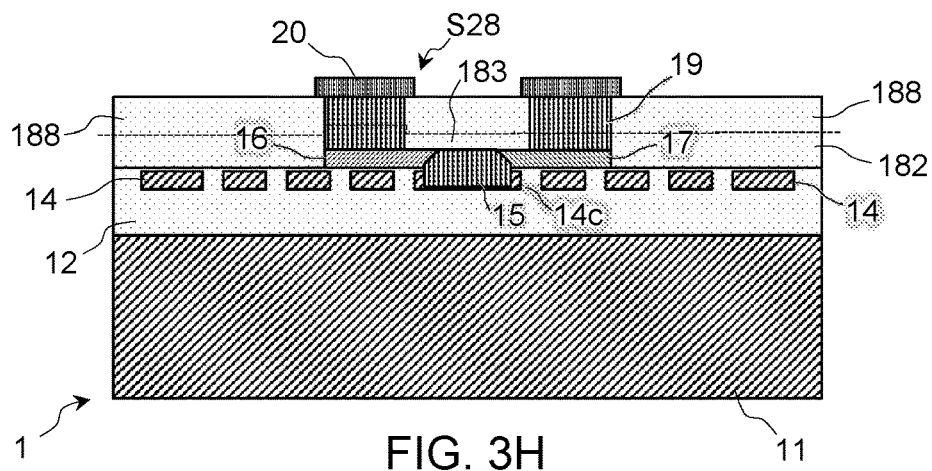

Referring now to FIG. 3G, an additional insulating layer 188 can be formed after having obtained S20-S23 the contact layers 16, 17 (and, if necessary, after a polishing step) and prior to opening S26 the trenches 19t. That is, the additional insulating layer 188 is deposited S24 on an exposed surface of the growth template. In FIGS. 3G and 3H, the exposed surface (as before deposition of layer 188) is denoted by a dashed line; the dashed line corresponds to the external envelope of the growth template. Thus, in FIG. 3G, the upper layer portion 188 corresponds to the newly deposited layer 188, while the lower layer portion corresponds to the previously structured template layer 182, 183. The trenches 19t, which are subsequently opened at step S26, will thus extend though both the additional insulating layer 188 and the layer portion 182, 183 of the lateral growth template.

Figure 4:
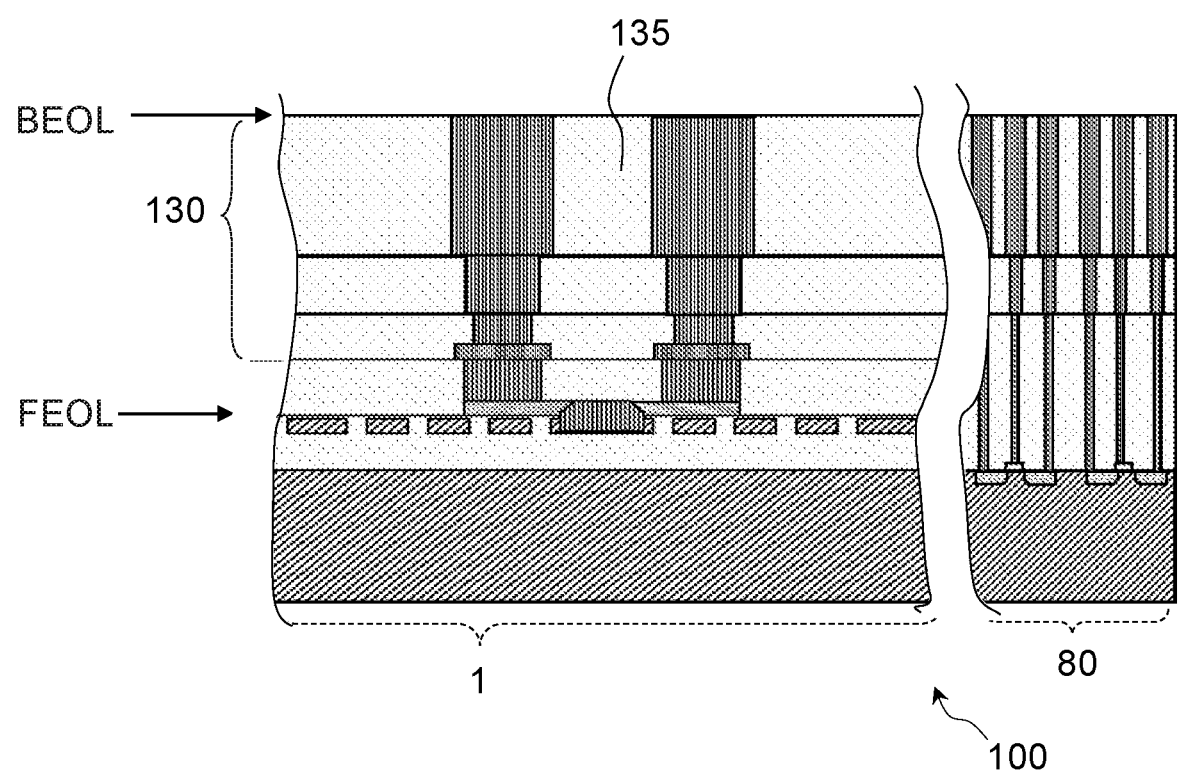
FIG. 4 is a 2D cross-sectional view illustrating a photodetector device such as shown in FIG. 1, co-integrated with an integrated circuit device, thereby forming an optoelectronic device, as in embodiments of the invention.

Once ohmic contacts 19, 20 have been formed, FIG. 3H, the obtained electro-optical device 1 can be co-integrated with other components, as illustrated in FIG. 4. The latter shows an integrated circuit 80 that is monolithically integrated with an electro-optical device 1 such as described above, as a complementary metal oxide semiconductor integrated circuit (CMOS IC), to form an optoelectronic device 100.

In detail, the optoelectronic device 100 can for example be a silicon (Si) photonic chip, including a lateral current collection device 1 such as described below. The chip 100 can include one or more Si core waveguides 14, for optical coupling purposes. Preferably, the Si photonic chip is CMOS-fabricated, this including CMOS-compatible metal contacts, vias and metal pads, etc., formed in various upper levels of the device 100, denoted by numeral reference 130 in FIG. 4. The cladding material 135 need be compatible with the integration of metal interconnects for CMOS circuits. The CMOS-compatible electro-optical device 1 is embedded in the back end of the line (BEOL) of the Si photonic chip 100.

Additional components 80 are provided on the chip 100. For example, the device(s) 1 is (are) preferably co-integrated, in the BEOL of the chip 100, with one or more CMOS-fabricated integrated circuits 80. For instance, the circuits 80 can include transistors configured for driving the electro-optical device(s) 1, where all appropriate contacts for all circuit components are provided in the upper stack 130. Sets of ohmic contacts (metal-semiconductor contacts) for the devices 1, 80 are formed by metal contacts which can themselves be joined by vertical metal vias and top metal pads (as assumed in FIG. 4), provided in the upper region 130. The top metal pads can be radiofrequency (RF) electrodes, although RF pads are not always needed, e.g., and notably not in case of full integration with transistors 80. In all cases, the contacts are arranged so as to enable lateral current injection/collection in the stack 15. The ohmic contacts will thus include n- and p-type contacts, respectively in contact with the n-doped layer 16 and the p-doped layer 17, see also FIG. 1 or 3H.

Figure 1:
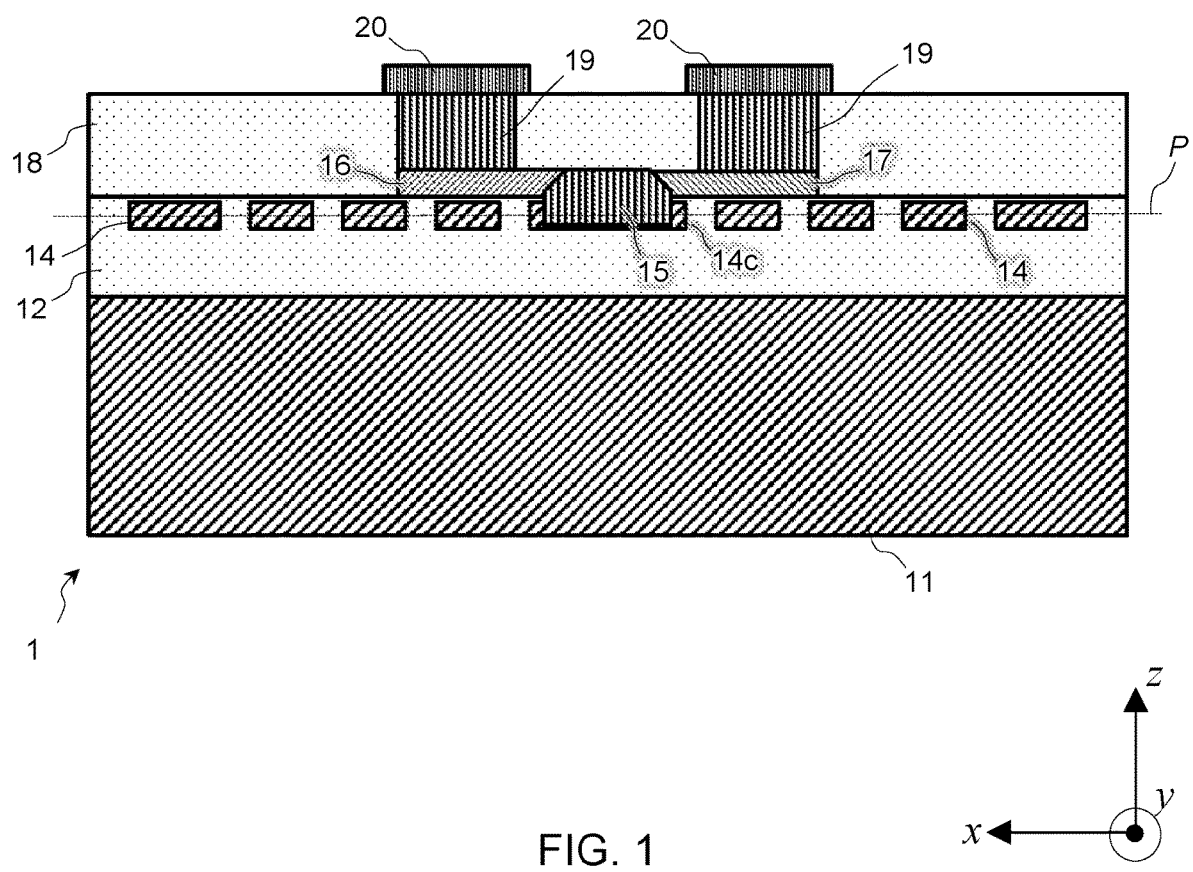
FIG. 1 is a 2D cross-sectional view of an electro-optical device according to embodiments. In this example, the device is assumed to be a lateral current collection photodetector, as in embodiments.

Referring to FIGS. 1, 2, a related, though more general aspect of the invention is now described in detail, which concerns an electro-optical device 1 such as obtained with fabrication methods as described above in reference to the first aspect of the invention. Aspects of this device 1 have already been described, be it implicitly; they are accordingly only briefly discussed in the following.

Consistently with the methods in accordance with aspects of the invention, the device 1 includes a waveguiding structure 14 with a trench 14t formed therein, and a stack 15 of optically active semiconductor materials. Such materials are stacked along the stacking direction z, i.e., perpendicular to the main plane P of the structure 14. The stack 15 rests on a bottom wall of the trench 14t, in direct contact with the waveguide core material of the waveguiding structure 14. As best seen in FIG. 1, the stack 15 is partly encapsulated in the waveguiding structure 14, e.g., at the level of a central region 14d of this structure 14.

As explained earlier, the contact layers 16, 17 include an n-doped contact layer 16 and a p-doped contact layer 17, each extending essentially/substantially parallel to the main plane P. Each contact layer 16, 17 extends from the upper portion of a respective, lateral side of the stack 15, e.g., from a tapered (e.g., (111)) surface above a raised portion of the cavity formed by the trench 14t.

Moreover, ohmic contacts 19, 20 extend through an insulating layer 18, e.g., made up by successively deposited layers 181, 182, 188, see FIGS. 3A-3H. This layer 18 covers top surfaces of the contact layers 16, 17 and the stack 15. The ohmic contacts 19, 20 contact respective contact layers 16, 17.

Because the electro-optical device 1 can be obtained with a method according to embodiments of the invention, the device 1 can include residual portions of a lateral growth template 182-186. In particular, the device 1 can include a residual portion 183 of an insulating layer 182 of material as used to obtain the lateral growth template 182-186, see FIG. 3H. This portion 183 defines inner surfaces of the cavities 16c, 17c, which inner surfaces border (i.e., are in contact with) the contact layers 16, 17. And more generally, what is here termed as a residual portion of the lateral growth template refers to any piece of layer material defining (or contributing to define) an inner cavity 16c, 17c as used for the lateral growth. For example, one can first directly grow the absorbing medium 15 from the core of a Si waveguide and then laterally regrow the doped contact layers 16, 17 due to the template material cladding 182-186, as explained earlier in reference to embodiments relating to the first aspect of the invention.

Referring back to FIG. 1, the top surfaces of the contact layers 16, 17 and the stack 15 can be flush (i.e., level), so as to ensure a shallow, compact structure 11-20. If necessary, a CMP step can be involved to planarize top surfaces of the components 15-17, after step S23. This, however, would likely not prevent residual portions from layer 182 (used to structure the growth template) to be present.

In embodiments of the invention, the stack 15 has an average thickness that is between 50 nm and 250 nm, to allow shallow structures. In some embodiments of the invention, it is between 120 nm and 220 nm. The thickness of the contact layers 16, 17, which are even thinner, can be between 25 and 140 nm. The thickness (height) of the system constituted by the waveguiding structure 14, the stack 15, and the contact layers 16, 17 can for example be between 200 and 400 nm (e.g., of about 320 nm). The thickness of the waveguiding structure 14, the stack 15 and contact layers 16, 17, plus the upper cladding with ohmic contacts 19, 20 will typically be between 1000 and 1500 nm.

The resulting, shallow structure favors an ultra-small capacitance, takes advantage of the high-mobility of the carriers and thus provides an ultra-high device bandwidth.

The cladding layers 181, 182, 188 (18) can include a same material, e.g., $SiO_2$. In variants, sapphire (i.e., crystalline $Al_2O_3$) or amorphous $Al_2O_3$ can also be relied on.

The stack 15 can include III-V compounds, preferably selected from the InP system, e.g., InAlGaAs, InGaAsP, InAlAs, and InGaAs. For example, the stack 15 can include $In_{1-x-y}Al_xGa_yAs$ ($0 \leq x \leq 1$, $0 \leq y \leq 1-x$), this including InAs, AlAs, InGaAs (e.g., for quantum dots lasers) and InAlGaAs. In particular, InAs quantum dots can be used when using an InP substrate. In variants, the III-V stack 15 can also include InGaAsP or InGaAsN. The III-V stack 15 can be configured as a multiple quantum well (MQW) section, sandwiched between other III-V materials, such as separate confinement heterostructures (SCH) layers (not shown), e.g. made of InP or GaAs, preferably lattice-matched to the MQW section to prevent defect formation, as needed to start the growth of the core III-V stacked layers. For laser application, one would preferably rely on a MQW section and SCH layers, whereas photodetector would most likely use bulk InGaAs. In variants, group IV materials can be used (most preferably including SiGe and Ge)

The contact layers 16, 17 can include InP, InAs or GaAs (or compounds thereof), for example. The III-V stack 105 can also include quantum dots sandwiched between quantum wells, as known per se. Usual metal-semiconductor contact materials can be used for the ohmic contacts 19, 20, preferably with metals compatible with standard Silicon CMOS processing requirements (e.g. Mo, W, TiN).

In particular, the composition of the stack 15 can be adjusted, so as for the effective refractive index of the stack 15 to essentially/substantially match the refractive index of the waveguide core material, in order to (contribute to) minimize optical losses (e.g., on insertion). One can for example use an $In_xGa_{1-x}As$ compound as absorbing medium, whose refractive index is tuned by the exact composition of the ternary compound in order to match the refractive index of a Si waveguide core.

As said, the device 1 can be configured as a lateral current collection photodetector 1, wherein the stack 15 of optically active semiconductor materials includes an intrinsically or intentionally doped region acting, in operation, as an optically absorbing medium. In this case, the system formed by the stack 15 and the contact layers 16, 17 acts as a p-i-n junction.

The device 1 can for example be configured as a hybrid III-V, or hybrid IV on silicon photodetector. That is, the stack 15 of III-V or IV semiconductor materials can be designed to allow a hybrid-mode optical coupling between an optically active region of the stack 15 and the waveguide core material, in operation. A hybrid mode refers to a mode that is partially in the optically active stack 15 and partially in the waveguide 14 underneath. Moreover, in the case where a photonic crystal cavity is used as waveguiding structure, the low dispersion slow light phenomenon can be relied on to enhance the responsivity of the system, if necessary. The slow light phenomenon results from a group index ng being much larger than the bulk material refractive index n, and thus a group velocity of supported optical modes strongly reduced in the proximity of the photonic bandgap. Note, the wavelength range of interest here can be in the optical range (i.e., 100 nm-1 mm, according to DIN 5031) and the terminology "radiation" as used herein refers to electromagnetic radiation in the wavelength range between 100 nm and 1 mm. However, the wavelength range will, in most applications, be between 200 nm and 7.5 µm. In particular, wavelengths of 1.3 and 1.55 µm are typically contemplated (and possibly 980 nm), for datacom and telecom applications as contemplated herein.

As best seen in FIG. 2, the waveguiding structure 14 can be structured so as to form a bidimensional photonic crystal, with said trench 14t arranged in a region 14d forming a crystal lattice crystal lattice defect of the photonic crystal. In variants, usual (straight) waveguide cores can be relied on. In both cases, the waveguiding structure 14 can include residual portions of a top silicon layer 14i of a SOI substrate, owing to preferred fabrication methods as discussed earlier.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "essentially," and variations thereof, are intended to include the degree of error associated with measurement of the particular quantity based upon the equipment available at the time of filing the application. For example, "about" can include a range of ±8% or 5%, or 2% of a given value.

While the present invention has been described with reference to a limited number of embodiments, variants and the accompanying drawings, it will be understood by those skilled in the art that various changes can be made and equivalents can be substituted without departing from the scope of the present invention. In particular, a feature (device-like or method-like) recited in a given embodiment, variant or shown in a drawing can be combined with or replace another feature in another embodiment, variant or drawing, without departing from the scope of the present invention. Various combinations of the features described in respect of any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly cited may be contemplated, as the skilled person may appreciate.

What is claimed is:

1. A method of fabrication of an electro-optical device, the method comprising:
    providing a waveguiding structure by patterning a top silicon layer of a silicon-on-insulator (SOI) substrate;
    opening a trench in the waveguiding structure, the trench comprising a blind cavity in the top silicon layer, the blind cavity comprising a bottom wall and raised sidewalls;
    directly growing, from the bottom wall of the blind cavity, a stack of optically active semiconductor materials, the latter stacked along a stacking direction z perpendicular to a main plane of the waveguiding structure, so as for the stack to be partly encapsulated in the waveguiding structure, whereby a bottommost layer of the stack is in direct contact with the bottom wall and the raised sidewalls of the blind cavity, whereas upper portions of opposite, lateral sides of the stack are exposed;
    depositing an insulating layer over the exposed upper portions of the stack and structuring the insulating layer to form a lateral growth template comprising a horizontal portion overhanging the stack, the horizontal portion defining a first lateral channel and a second lateral channel, each lateral channel extending from a respective lateral side of the exposed upper portions;
    laterally growing contact layers in the first lateral channel and the second lateral channel, wherein the contact layers comprise an n-doped contact layer and a p-doped contact layer of material, each extending from a respective one of the upper portions of opposite lateral sides of the stack, essentially parallel to said main plane; and
    opening trenches in the lateral growth template to form ohmic contacts extending through such trenches to contact respective ones of the contact layers obtained.

2. The method according to claim 1, wherein, subsequent to having grown the stack, the contact layers are laterally regrown, one after the other, due to the lateral growth template formed.

3. The method according to claim 1, wherein laterally growing the contact layers comprises directly growing one of the contact layers following the direct growth of the stack of optically active semiconductor materials, prior to laterally regrowing the other one of said contact layers.

4. The method according to claim 1, wherein each of the n-doped contact layer and the p-doped contact layer is laterally grown from a plane surface of the stack.

5. The method according to claim 1, wherein the method further comprises cladding the waveguide structure provided, prior to directly growing the stack of optically active semiconductor materials.

6. The method according to claim 1, wherein the lateral growth template is formed so as to include a layer portion extending parallel to the main plane of the waveguiding structure and overhanging the stack, said layer portion including an aperture on one lateral side of the stack.

7. The method according to claim 6, wherein the method further includes, after having obtained the contact layers and prior to opening the trenches in the lateral growth template, depositing an additional insulating layer on an exposed surface of the growth template, whereby the trenches are subsequently opened though both the additional insulating layer and said layer portion of the lateral growth template.

8. The method according to claim 1, wherein:
    the top silicon layer of said substrate is structured so as to form the waveguiding structure as a bidimensional photonic crystal, and
    said trench is opened in a region forming a crystal lattice defect of the photonic crystal.

9. The method according to claim 1, wherein the method further comprises co-integrating said electro-optical device with an integrated circuit, whereby said circuit is monolithically integrated with said electro-optical device, as a complementary metal oxide semiconductor integrated circuit, to form an optoelectronic device.

* * * * *